United States Patent
Tsou et al.

(10) Patent No.: US 12,245,373 B2
(45) Date of Patent: Mar. 4, 2025

(54) PRINTED CIRCUIT BOARD AND ELECTRONIC DEVICE INCLUDING SAME

(71) Applicant: ASUSTEK COMPUTER INC., Taipei (TW)

(72) Inventors: Ping-Han Tsou, Taipei (TW); Li-Chien Wan, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 54 days.

(21) Appl. No.: 17/592,126

(22) Filed: Feb. 3, 2022

(65) Prior Publication Data
US 2023/0031184 A1   Feb. 2, 2023

(30) Foreign Application Priority Data
Jul. 30, 2021   (TW) .................. 110128044

(51) Int. Cl.
*H05K 1/02* (2006.01)
*H05K 1/09* (2006.01)
*H05K 1/11* (2006.01)
*H05K 1/18* (2006.01)

(52) U.S. Cl.
CPC .......... *H05K 1/092* (2013.01); *H05K 1/0201* (2013.01); *H05K 1/111* (2013.01); *H05K 1/0206* (2013.01); *H05K 1/181* (2013.01); *H05K 2201/0323* (2013.01)

(58) Field of Classification Search
CPC ...... H05K 1/092; H05K 1/0201; H05K 1/181; H05K 2201/0323; H05K 2201/0209; H05K 3/3452; H05K 3/284; H05K 1/0209
See application file for complete search history.

(56) References Cited

U.S. PATENT DOCUMENTS

| | | | | |
|---|---|---|---|---|
| 6,208,031 B1 * | 3/2001 | Fraivillig | ............ | H01L 23/473 257/E23.098 |
| 6,656,389 B2 * | 12/2003 | Iruvanti | ............ | H01L 23/3737 252/514 |
| 7,312,401 B2 * | 12/2007 | Tsukada | ............ | H05K 1/0366 174/262 |
| 10,130,002 B2 * | 11/2018 | Hwang | ............ | B32B 27/06 |

(Continued)

FOREIGN PATENT DOCUMENTS

| CN | 105820646 A | 8/2016 |
|---|---|---|
| CN | 106700722 A | 5/2017 |

(Continued)

*Primary Examiner* — Ishwarbhai B Patel
(74) *Attorney, Agent, or Firm* — Muncy, Geissler, Olds & Lowe, P.C.

(57) ABSTRACT

A printed circuit board is provided. The printed circuit board includes a substrate, an electrically conductive pattern layer, and a thermally conductive ink layer. The substrate includes a first surface. The electrically conductive pattern layer is located on the first surface and includes a contact portion and a wire portion. The thermally conductive ink layer covers the wire portion and exposes the contact portion. The thermally conductive ink layer includes a thermally conductive powder and a colloidal adhesive, where a weight percentage of the thermally conductive powder is less than 10%, and a weight percentage of the colloidal adhesive is higher than 80%. An electronic device including the printed circuit board is further provided.

9 Claims, 2 Drawing Sheets

(56) References Cited

U.S. PATENT DOCUMENTS

| | | | | |
|---|---|---|---|---|
| 2005/0133916 | A1* | 6/2005 | Karnezos | H01L 25/03 257/E25.023 |
| 2012/0031652 | A1* | 2/2012 | Tseng | C25D 5/022 156/247 |
| 2012/0091570 | A1* | 4/2012 | Pan | H01L 21/568 257/676 |
| 2015/0163958 | A1* | 6/2015 | Oguma | H01L 23/552 524/556 |
| 2016/0050744 | A1* | 2/2016 | Lee | H01L 23/3677 361/712 |
| 2019/0002641 | A1* | 1/2019 | Huang | C08L 79/08 |
| 2019/0210322 | A1* | 7/2019 | Yoo | H01L 23/3731 |
| 2021/0007224 | A1* | 1/2021 | Orlowski | H05K 1/113 |
| 2021/0035961 | A1* | 2/2021 | Lim | H01L 21/561 |

FOREIGN PATENT DOCUMENTS

| | | | |
|---|---|---|---|
| CN | 106967277 | A | 7/2017 |
| CN | 212413507 | U | 1/2021 |
| TW | 200704348 | A | 1/2007 |

* cited by examiner

PRINTED CIRCUIT BOARD AND ELECTRONIC DEVICE INCLUDING SAME

CROSS-REFERENCE TO RELATED APPLICATION

This application claims the priority benefit of Taiwan application serial No. 110128044, filed on Jul. 30, 2021. The entirety of the above-mentioned patent application is hereby incorporated by reference herein and made a part of the specification.

BACKGROUND OF THE INVENTION

Field of the Invention

The disclosure relates to a printed circuit board, and in particular, to a printed circuit board having a thermal conduction function.

Description of the Related Art

Product performance of printed circuit board products are likely to degrade because of heat accumulation of electronic elements. In most conventional solutions, external elements such as fans, heat-dissipation fins, and thermally conductive fins, are adopted to improve heat dissipation. However, in addition to increased assembly costs and occupation of circuit board space, such solutions cause electromagnetic interference problems.

BRIEF SUMMARY OF THE INVENTION

The disclosure provides a printed circuit board. The printed circuit board includes a substrate, an electrically conductive pattern layer, and a thermally conductive ink layer. The substrate includes a first surface. The electrically conductive pattern layer is located on the first surface and includes a contact portion and a wire portion. The thermally conductive ink layer covers the wire portion and exposes the contact portion. The thermally conductive ink layer includes a thermally conductive powder and a colloidal adhesive, where a weight percentage of the thermally conductive powder is less than 10%, and a weight percentage of the colloidal adhesive is higher than 80%.

The present disclosure further provides an electronic device. The electronic device includes a printed circuit board, at least one electronic element, and a thermally conductive material layer. The printed circuit board includes a substrate, an electrically conductive pattern layer, and a thermally conductive ink layer. The substrate includes a first surface. The electrically conductive pattern layer is located on the first surface and includes a contact portion and a wire portion. The thermally conductive ink layer covers the wire portion and exposes the contact portion. The thermally conductive ink layer includes a thermally conductive powder and a colloidal adhesive, where a weight percentage of the thermally conductive powder is less than 10%, and a weight percentage of the colloidal adhesive is higher than 80%. The electronic element is disposed on the thermally conductive ink layer and is connected to the contact portion. A thermally conductive material covers the electronic element and extends to come into contact with the thermally conductive ink layer.

DETAILED DESCRIPTION OF THE EMBODIMENTS

More detailed descriptions of specific embodiments of the disclosure are provided below with reference to the schematic diagrams. The advantages and features of the disclosure are described more clearly according to the following description and claims. It should be noted that all of the drawings use very simplified forms and imprecise proportions, only being used for assisting in conveniently and clearly explaining the objective of the embodiments of the disclosure.

Figure 1:
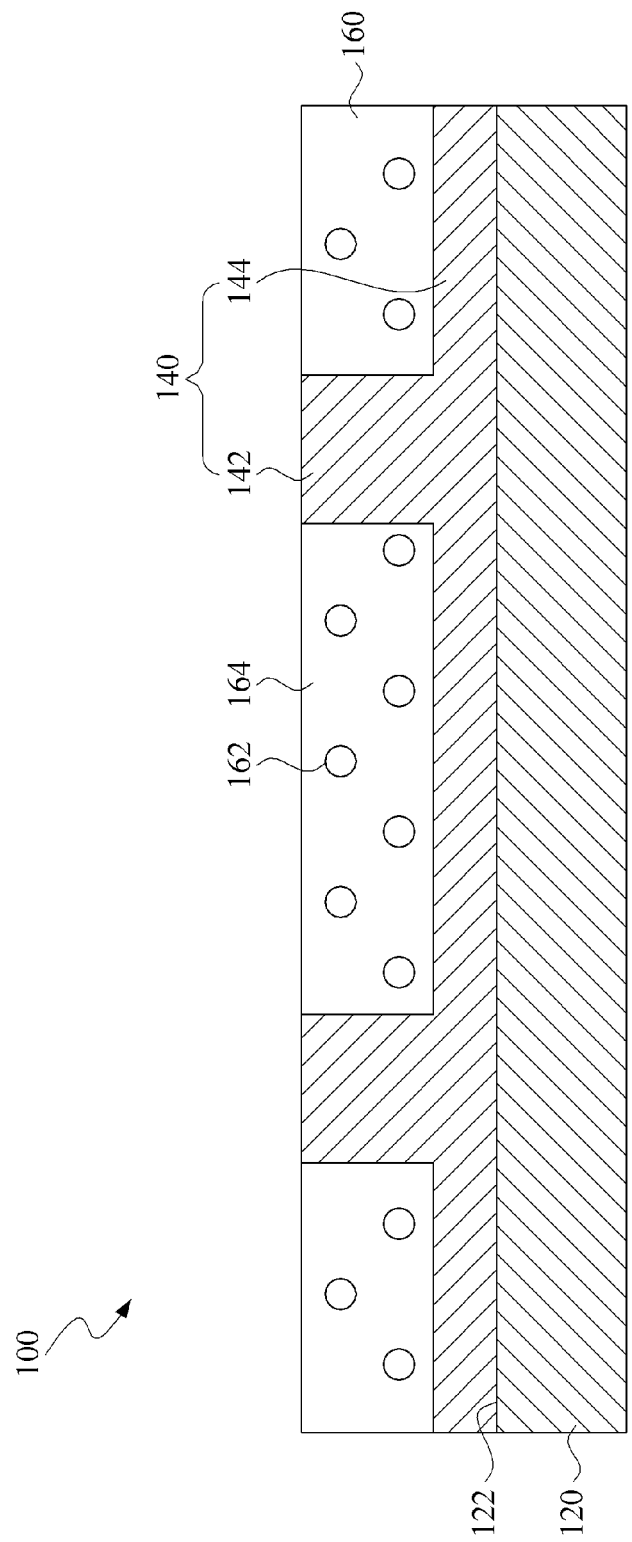
FIG. 1 is a schematic cross-sectional view of an embodiment of a printed circuit board according to the disclosure.

FIG. 1 is a schematic cross-sectional view of an embodiment of a printed circuit board according to the disclosure. As shown in the figure, the printed circuit board 100 includes a substrate 120, an electrically conductive pattern layer 140, and a thermally conductive ink layer 160.

The substrate 120 includes a first surface 122. The electrically conductive pattern layer 140 is located on the first surface 122 and includes a contact portion 142 and a wire portion 144. At least one electronic element, such as a wafer, a resistor, an inductor, and a capacitor, is disposed on the contact portion 142, and is connected to another element by the wire portion 144.

In an embodiment, the substrate 120 is either a rigid substrate or a flexible substrate.

In an embodiment, the electrically conductive pattern layer 140 is either a copper metal layer or an aluminum metal layer.

In an embodiment, the contact portion 142 of the electrically conductive pattern layer 140 includes a contact pad, a via hole, or both. The contact pad is used as an example in the figure. The contact pad is used for electrically connecting to a surface mount device, and the via hole is used for electrically connecting to a plug-in unit.

The thermally conductive ink layer 160 covers the wire portion 144 of the electrically conductive pattern layer 140 and exposes the contact portion 142.

In an embodiment, the thermally conductive ink layer 160 covers a part of the first surface 122, and has an opening left in a region corresponding to the contact portion 142 to facilitate installation of the electronic element. In terms of a manufacturing process, the thermally conductive ink layer 160 is formed in a printing or spraying manner.

The thermally conductive ink layer 160 includes a thermally conductive powder 162 and a colloidal adhesive 164. The thermally conductive powder 162 is uniformly distributed in the colloidal adhesive 164. By adjusting a proportion of the thermally conductive powder 162 in the thermally conductive ink layer 160 or using an electrically non-conductive thermally conductive powder 162, the thermally conductive ink layer 160 produces an insulation effect to facilitate replacement of a conventional solder mask. In this way, use of the solder mask is omitted to reduce manufacturing costs.

In an embodiment, the thermally conductive powder 162 is a non-metallic thermally conductive powder to provide an insulation effect. In an embodiment, the thermally conductive powder 162 is selected from a group consisting of a carbon powder, a graphene powder, a hexagonal boron carbide powder, a carbon nanopowder, a carbon fiber powder, and a diamond powder.

In an embodiment, the colloidal adhesive 164 is either a light-cured material or a heat-cured material.

In an embodiment, a weight percentage of the thermally conductive powder 162 is less than 10%, and a weight percentage of the colloidal adhesive 164 is higher than 80%. In an embodiment, a small amount of dispersant is added into thermally conductive ink to improve the uniformity of the thermally conductive powder 162.

In an embodiment, the thermally conductive ink layer 160 is coated on both an upper surface and a lower surface of the substrate 120 to improve heat dissipation.

In an embodiment, the thermally conductive ink layer 160 is located on an uppermost layer (instead of the solder mask) of the printed circuit board 100, or is located on an inner interlayer of a multi-layer printed circuit board for insulation, to improve heat dissipation of the printed circuit board.

Figure 2:
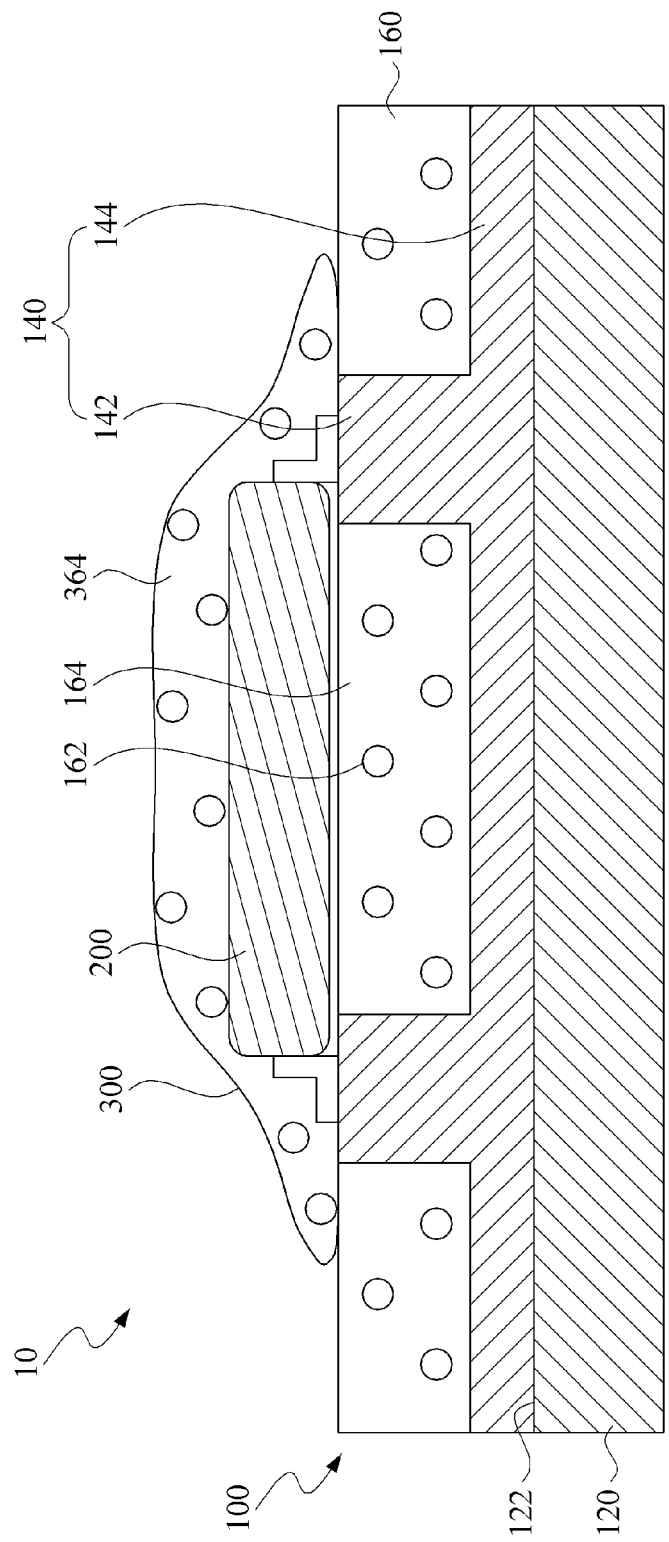
FIG. 2 is a schematic cross-sectional view of an embodiment of an electronic device according to the disclosure.

FIG. 2 is a schematic cross-sectional view of an embodiment of an electronic device 10 according to the disclosure. The electronic device 10 includes the printed circuit board 100 shown in FIG. 1, an electronic element 200, and a thermally conductive material layer 300. The electronic device 10 is either a motherboard or another electronic module including the printed circuit board 100.

The electronic element 200 is disposed on the thermally conductive ink layer 160 and is connected to the contact portion 142 of the electrically conductive pattern layer 140. The electronic element 200 is either a surface mount device or a plug-in unit. The surface mount device is used as an example in the figure. The surface mount device is electrically connected to the contact pad. Secondly, the electronic element is either a packaged element or a bare die.

The thermally conductive material layer 300 covers the electronic element 200 and extends to come into contact with the thermally conductive ink layer 160. The thermally conductive material layer 300 forms a thermally conductive path to transfer heat generated by operation of the electronic element 200 to the thermally conductive ink layer 160.

The heat generated during operation of the electronic element 200 is transferred to the printed circuit board 100 through the contact portion 142 of the electrically conductive pattern layer 140 for being discharged outside, or is transferred to the printed circuit board 100 through the thermally conductive material layer 300 for being discharged outside. In this way, the temperature of the electronic element 200 is prevented from being excessively high. In an embodiment, the thermally conductive material layer 300 completely covers the electronic element 200.

In an embodiment, the thermally conductive material layer 300 and the thermally conductive ink layer 160 are made of different materials. In an embodiment, for the thermally conductive material layer 300, a thermally conductive powder 162 having the same proportion and the same type as those in the thermally conductive ink layer 160 is adopted, but a colloidal adhesive 364 with relatively good fluidity is selected to facilitate coating the thermally conductive material layer 300 on the electronic element 200 in a spraying manner.

In addition, it is considered that the thermally conductive material layer 300 needs to effectively cover the electronic element 200, the colloidal adhesive 364 with higher viscosity is selected to ensure that the thermally conductive material layer 300 has a sufficient thickness. In another embodiment, to reduce manufacturing costs, the material composition of the thermally conductive material layer 300 is the same as the material composition of the thermally conductive ink layer 160.

The printed circuit board 100 provided in the disclosure includes the thermally conductive ink layer 160 to replace a conventional solder mask. The thermally conductive ink layer 160 includes the thermally conductive powder 162 inside, to provide an effective thermal conduction effect while maintaining an insulation property, to resolve a problem that product performance of printed circuit board products degrades because of heat accumulation of electronic elements.

The above are merely preferred embodiments of the disclosure, and do not constitute any limitation on the disclosure. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A printed circuit board, comprising:
   a substrate, comprising a first surface;
   an electrically conductive pattern layer, located on the first surface and comprising a contact portion and a wire portion; and
   a thermally conductive ink layer, covering the wire portion and exposing the contact portion, wherein the thermally conductive ink layer comprises a thermally conductive powder and a colloidal adhesive, a weight percentage of the thermally conductive powder is less than 10%, and a weight percentage of the colloidal adhesive is higher than 80%,
   wherein the thermal conductive ink layer is used as a solder mask;
   wherein the thermally conductive ink layer comprises dispersant;
   wherein an exposed surface of the contact portion is aligned with an upper surface of the thermal conductive ink layer.

2. The printed circuit board according to claim 1, wherein the thermally conductive powder is selected from the group consisting of a graphene powder, a hexagonal boron carbide powder, and a carbon nanopowder.

3. The printed circuit board according to claim 1, wherein the thermally conductive powder is a nonmetallic thermally conductive powder.

4. The printed circuit board according to claim 1, wherein the contact portion comprises a contact pad.

5. The printed circuit board according to claim 1, wherein the colloidal adhesive is a light-cured material.

6. An electronic device, comprising:
   a printed circuit board, comprising:
   a substrate, comprising a first surface;
   an electrically conductive pattern layer, located on the first surface and comprising a contact portion and a wire portion; and
   a thermally conductive ink layer, covering the wire portion and exposing the contact portion, wherein the thermally conductive ink layer comprises a thermally conductive powder and a colloidal adhesive, a weight percentage of the thermally conductive powder is less than 10%, and a weight percentage of the colloidal adhesive is higher than 80%;
   an electronic element, disposed on the thermally conductive ink layer and connected to the contact portion; and
   a thermally conductive material layer, covering the electronic element and extending to come into contact with the thermally conductive ink layer,
   wherein the thermal conductive ink layer is used as a solder mask;

wherein the thermally conductive ink layer comprises dispersant;

wherein an exposed surface of the contact portion is aligned with an upper surface of the thermal conductive ink layer.

7. The electronic device according to claim 6, wherein the composition of the thermally conductive material layer is the same as the composition of the thermally conductive ink layer.

8. The electronic device according to claim 6, wherein the thermally conductive powder is selected from the group consisting of a graphene powder, a hexagonal boron carbide powder, and a carbon nanopowder.

9. The electronic device according to claim 6, wherein the colloidal adhesive is a light-cured material.

* * * * *